US012087883B2

(12) United States Patent
Yamaguchi et al.

(10) Patent No.: US 12,087,883 B2
(45) Date of Patent: Sep. 10, 2024

(54) DISPLAY DEVICE

(71) Applicant: Japan Display Inc., Tokyo (JP)

(72) Inventors: Hidemasa Yamaguchi, Tokyo (JP); Masanobu Ikeda, Tokyo (JP)

(73) Assignee: Japan Display Inc., Tokyo (JP)

( * ) Notice: Subject to any disclaimer, the term of this patent is extended or adjusted under 35 U.S.C. 154(b) by 437 days.

(21) Appl. No.: 17/588,431

(22) Filed: Jan. 31, 2022

(65) Prior Publication Data

US 2022/0158036 A1    May 19, 2022

Related U.S. Application Data

(63) Continuation of application No. PCT/JP2020/027501, filed on Jul. 15, 2020.

(30) Foreign Application Priority Data

Aug. 2, 2019    (JP) .................................. 2019-142981

(51) Int. Cl.
H01L 33/62         (2010.01)
H01L 25/075        (2006.01)
H01L 33/10         (2010.01)
H01L 33/38         (2010.01)

(52) U.S. Cl.
CPC ........ H01L 33/382 (2013.01); H01L 25/0753 (2013.01); H01L 33/10 (2013.01); H01L 33/62 (2013.01)

(58) Field of Classification Search
CPC ........ H01L 33/62; H01L 33/382; H01L 33/10
See application file for complete search history.

(56) References Cited

U.S. PATENT DOCUMENTS

2009/0224276 A1    9/2009  Igari et al.
2017/0179092 A1*   6/2017  Sasaki ................... H01L 25/167
2018/0219123 A1    8/2018  Wang et al.

FOREIGN PATENT DOCUMENTS

| EP | 1 061 590 A1 | 12/2000 |
| JP | 2003-168825 A | 6/2003 |
| JP | 2004-119147 A | 4/2004 |
| JP | 2007-42851 A | 2/2007 |
| JP | 2008-234928 A | 10/2008 |
| WO | 2014/149864 A1 | 9/2014 |

OTHER PUBLICATIONS

International Search Report mailed on Sep. 8, 2020 for PCT Application PCT/JP2020/027501, which English translation.

* cited by examiner

Primary Examiner — Douglas M Menz
(74) Attorney, Agent, or Firm — Michael Best & Friedrich LLP

(57) ABSTRACT

According to one embodiment, a display device includes a substrate, an anode electrode, a light emitting element and a reflector plate. The anode electrode is arranged on the substrate. The light emitting element is mounted on the anode electrode. The reflector plate is arranged under the anode electrode, and is arranged to overlap a region where the light emitting element is mounted, in planar view. An anode terminal is arranged on a bottom part and electrically connected to the anode electrode. A cathode terminal is arranged across an entire upper surface on a side opposite to the anode terminal. The anode electrode being smaller than the cathode terminal in a position overlapping the region where the light emitting element is mounted in planar view.

10 Claims, 8 Drawing Sheets

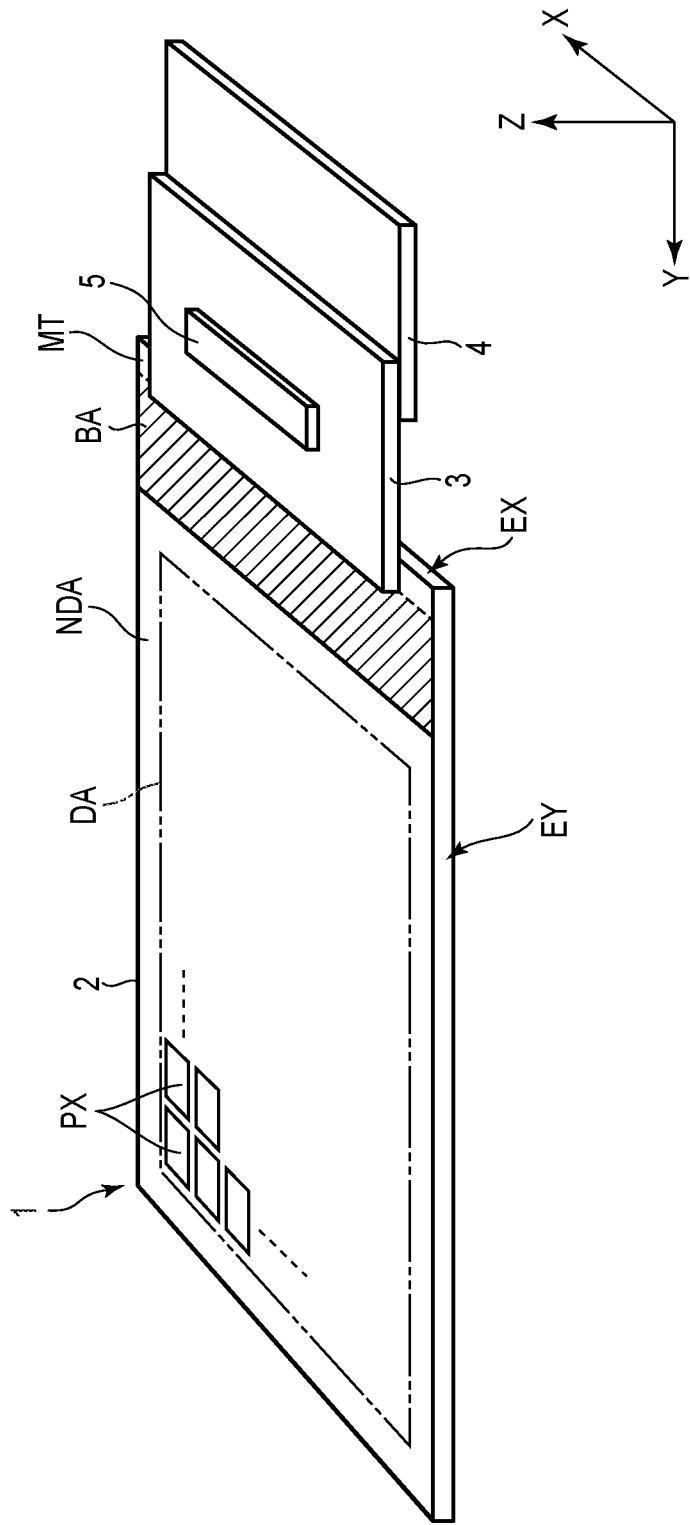
F I G. 1

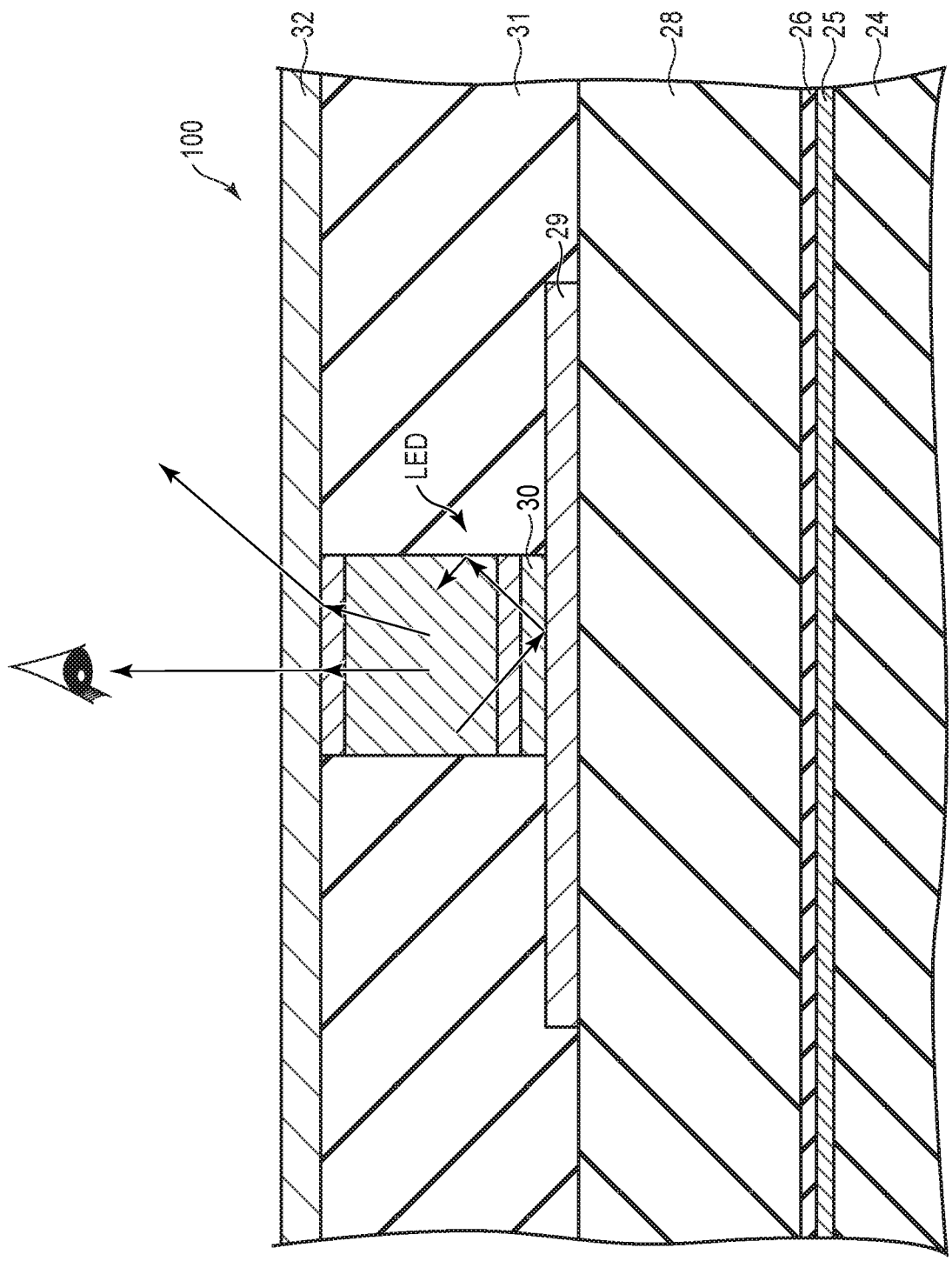
F I G. 5

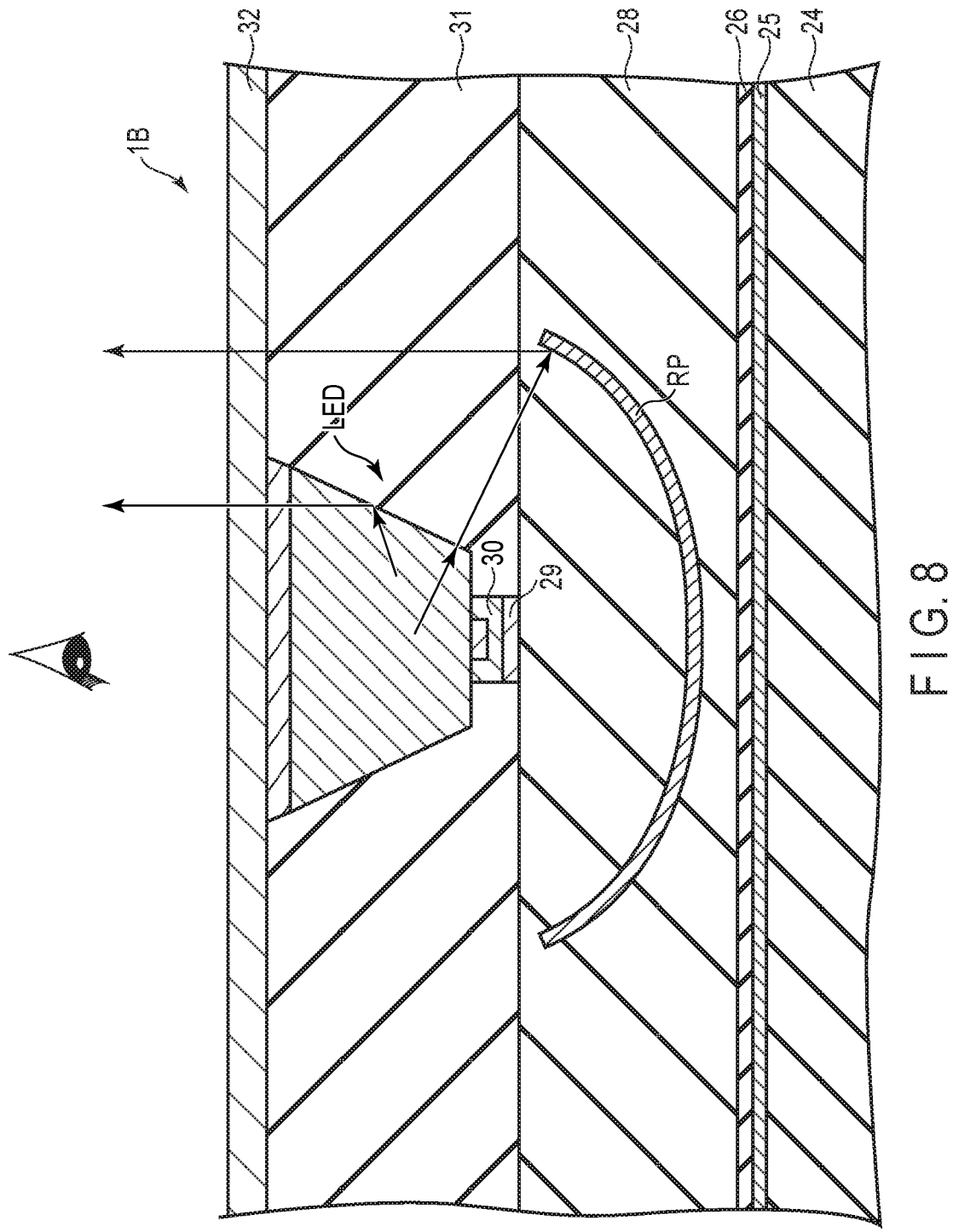
F I G. 8

DISPLAY DEVICE

CROSS-REFERENCE TO RELATED APPLICATIONS

This application is a Continuation Application of PCT Application No. PCT/JP2020/027501, filed Jul. 15, 2020 and based upon and claiming the benefit of priority from Japanese Patent Application No. 2019-142981, filed Aug. 2, 2019, the entire contents of all of which are incorporated herein by reference.

FIELD

Embodiments described herein relate generally to a display device.

BACKGROUND

An LED display using the light emitting diode (LED) which is a spontaneous light emitting element is known but, recently, a display device (hereinafter referred to as a micro LED display) using a minute diode element referred to as a micro LED has been developed.

Since a number of chip-shaped micro LEDs are mounted in a display area, unlike a conventional liquid crystal display or organic EL display, the micro LED display can easily achieve both high definition and upsizing and is focused as a next generation display.

However, since the micro LED has a characteristic of diffusing and emitting light in multiple directions, the amount of light in the front direction of the micro LED display is small, which may cause a decrease in brightness. Furthermore, since the refractive index of the diode element is high, the external extraction efficiency is low.

BRIEF DESCRIPTION OF THE DRAWINGS

FIG. 1 is a perspective view schematically showing a configuration of a display device according to one embodiment.

FIG. 5 is a cross-sectional view schematically showing an example of a sectional structure of the display device according to a comparative example.

FIG. 8 is a cross-sectional view schematically showing an example of a sectional structure of the display device according to a second modified example of the embodiment.

DETAILED DESCRIPTION

Figure 2:
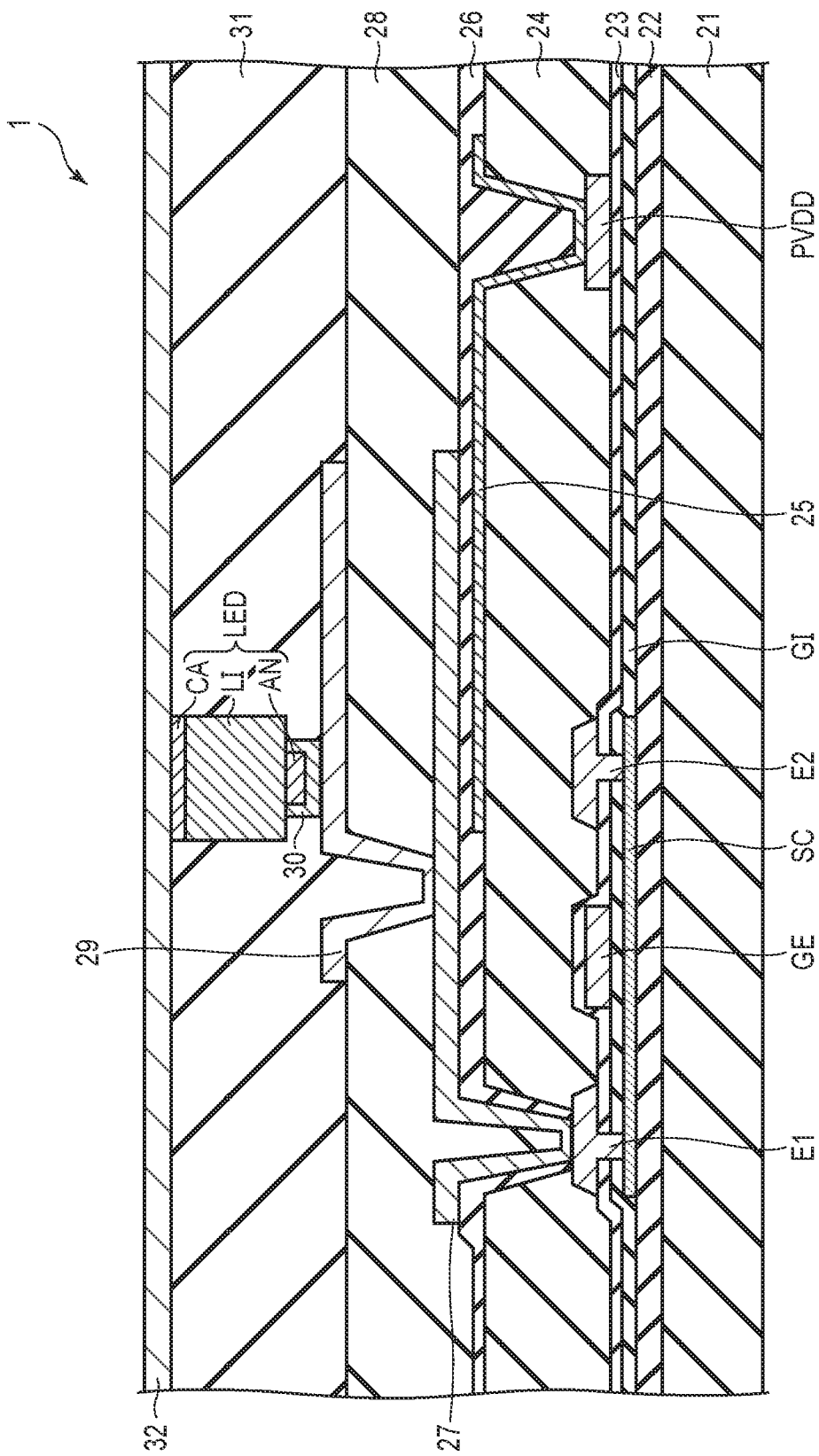
FIG. 2 is a cross-sectional view schematically showing an example of a sectional structure of the display device according to the embodiment.

In general, according to one embodiment, a display device includes a substrate, an anode electrode, a light emitting element and a reflector plate. The anode electrode is arranged on the substrate. The light emitting element is mounted on the anode electrode. The reflector plate is arranged under the anode electrode, and is arranged to overlap a region where the light emitting element is mounted, in planar view. The light emitting element includes an anode terminal and a cathode terminal. The anode terminal is arranged on a bottom part and electrically connected to the anode electrode. The cathode terminal is arranged across an entire upper surface on a side opposite to the anode terminal. The anode electrode being smaller than the cathode terminal in a position overlapping the region where the light emitting element is mounted in planar view.

Several embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In the drawings, reference numbers of continuously arranged elements equivalent or similar to each other are omitted in some cases. In addition, in the specification and drawings, structural elements which function in the same or a similar manner to those described in connection with preceding drawings are denoted by like reference numbers, detailed description thereof being omitted unless necessary.

FIG. 1 is a perspective view schematically showing a configuration of a display device 1 according to one embodiment. FIG. 1 shows a three-dimensional space defined by a first direction X, a second direction Y perpendicular to the first direction X, and a third direction Z perpendicular to the first direction X and the second direction Y. Incidentally, the first direction X and the second direction Y are orthogonal to each other, but may cross each other at any angle other than 90 degrees. In addition, the third direction Z is defined as an upper or upward direction while a direction opposite to the third direction Z is defined as a lower or downward direction, in the embodiment. According to "a second member above/on a first member" and "a second member below/under a first member", the second member may be in contact with the first member or may be separated from the first member.

In the embodiment, a case where the display device 1 is a micro LED display device (micro LED display) using a micro LED which is a self-luminous element will be mainly described below.

As shown in FIG. 1, the display device 1 comprises a display panel 2, a first circuit board 3, a second circuit board 4, and the like.

The display panel 2 has, for example, a rectangular shape. In the example illustrated, shorter sides EX of the display panel 2 are parallel to the first direction X and longer sides EY of the display panel 2 are parallel to the second direction Y. The third direction Z corresponds to a thickness direction of the display panel 2. The first direction X may be restated as a direction parallel to the shorter sides of the display device 1, the second direction Y may be restated as a direction parallel to the longer sides of the display device 1, and the third direction Z may be restated as a thickness direction of the display device 1.

The main surface of the display panel 2 is parallel to an X-Y plane defined by the first direction X and the second direction Y. The display panel 2 includes a display area DA and a non-display area NDA located outside the display area DA. The non-display area NDA includes a terminal area MT. In the example illustrated, the non-display area NDA surrounds the display area DA.

The display area DA is an area where an image is displayed, and includes, for example, a plurality of pixels PX arrayed in a matrix. The pixel PX includes a light emitting element (micro LED), a switching element (drive transistor) for driving the light emitting element, and the like.

The terminal area MT is provided along the shorter sides EX of the display panel 2, and includes terminals for electrically connecting the display panel 2 to an external device or the like.

The first circuit board 3 is mounted on the terminal area MT and is electrically connected to the display panel 2. The first circuit board 3 is, for example, a flexible printed circuit. The first circuit board 3 comprises a driver IC chip (hereinafter referred to as a panel driver) 5 which drives the display panel 2, and the like. In the example illustrated, the panel driver 5 is arranged on the first circuit board 3, but may be arranged below. Alternatively, the panel driver 5 may be mounted on a circuit board other than the first circuit board 3, or may be mounted on, for example, the non-display area NDA of the display panel 2 or, for example, the second circuit board 4. The second circuit board 4 is, for example, a rigid printed circuit board. The second circuit board 4 is connected to the first circuit board 3, for example, at a position under the first circuit board 3.

The above panel driver 5 is connected to a control board (not shown) via, for example, the second circuit board 4. For example, the panel driver 5 performs control of displaying an image on the display panel 2 by driving a plurality of pixels PX, based on video signals output from the control board.

Incidentally, the display panel 2 may include a bending area BA represented by oblique lines. The bending area BA is an area which is bended when the display device 1 is accommodated in a housing of the electronic apparatus or the like. The bending area BA is located on the terminal area MT side of the non-display area NDA. In a state in which the bending area BA is bended, the first circuit board 3 and the second circuit board 4 are arranged to be opposed to the display panel 2.

FIG. 2 schematically shows the cross-sectional structure of the display device 1 (display panel 2). An example in which a fine light emitting element referred to as the above micro LED is mounted on the substrate as a display element will be described. FIG. 2 mainly shows the structure of the portion where the above-mentioned micro LED and a thin film transistor (TFT) constituting the pixel are connected.

In addition, as described later, the pixel PX includes, for example, three sub-pixels SPR, SPG, and SPB such as a red sub-pixel SPR, a green sub-pixel SPG, and a blue sub-pixel SPB and, since all the three sub-pixels SPR, SPG, and SPB have the same configuration, only the structure corresponding to one sub-pixel is shown in FIG. 2.

An array substrate AR of the display panel 2 shown in FIG. 2 comprises an insulating substrate 21. The material of the insulating substrate 21 is not particularly limited as long as it can withstand the processing temperature during the TFT process, and a glass substrate such as quartz or non-alkali glass or a resin substrate such as polyimide can be mainly used. The resin substrate has flexibility, and the display device 1 can be configured as a sheet display. Incidentally, not only polyimide, but the other resin material may be used as the resin substrate. Based on the above, the insulating substrate 21 may be referred to as an organic insulating layer or a resin layer. In addition, the thin film glass substrate may be curved only in the bending area BA.

An undercoat layer 22 of a three-layer stacked structure is provided on the insulating substrate 21. Illustration of details is omitted in figures, but the undercoat layer 22 includes a lowermost layer formed of silicon oxide ($SiO_2$), a middle layer formed of silicon nitride (SiN), and an uppermost layer formed of silicon oxide ($SiO_2$). The lowermost layer is provided to improve adhesion to the insulating substrate 21 which is the base. The middle layer is provided as a blocking film against moisture and impurities from the outside. The uppermost layer is provided as a block film that prevents hydrogen atoms contained in the middle layer from diffusing toward a semiconductor layer SC side which will be described later.

Incidentally, the undercoat layer 22 is not limited to this structure. The undercoat layer 22 may further include stacked layers or may have a single-layer structure or a two-layer structure. For example, when the insulating substrate 21 is a glass substrate, a silicon nitride film may be formed directly on the insulating substrate 21 since the silicon nitride film has relatively good adhesion.

A light-shielding layer (not shown) is arranged on the insulating substrate 21. The position of the light-shielding layer is made to correspond to a location where TFT is to be formed later. The light-shielding layer may be formed of a material having a light-shielding property such as a metal layer or a black layer. According to the light-shielding layer, entry of light to a back surface of the channel of the TFT can be suppressed, and variation in the TFT properties resulting from the light that can be made incident from the insulating substrate 21 side can be thereby suppressed. Incidentally, when the light-shielding layer is formed of a conductive layer, a backgate effect can be assigned to the TFT by supplying a predetermined potential to the light-shielding layer.

A TFT (for example, a drive transistor) is formed on the above-described undercoat layer 22. A polysilicon TFT using polysilicon for the semiconductor layer SC is used as an example of the TFT. However, the semiconductor layer SC is not limited to polysilicon, but may also be an oxide semiconductor or amorphous silicon. In the embodiment, the semiconductor layer SC is formed using low temperature polysilicon. Either Nch TFT or Pch TFT may be used as the TFT. Alternatively, the Nch TFT and the Pch TFT may be formed simultaneously. A case where the Nch TFT is used as the drive transistor will be described below.

The semiconductor layer SC of the Nch TFT includes a first region, a second region, a channel region between the first region and the second region, and low-concentration impurity regions that are provided between the channel region and the first region and between the channel region and the second region, respectively. One of the first region and the second region functions as a source region, and the other of the first region and the second region functions as a drain region.

A gate insulating film GI is formed by using a silicon oxide film, and a gate electrode GE is formed of molybdenum tungsten (MoW). Incidentally, the gate electrode GE comprises a function of a storage capacitor electrode, which will be described later, in addition to a function of the gate electrode of the TFT. The example of the top-gate TFT has been described, and the TFT may be a bottom-gate TFT.

An interlayer insulating film 23 is provided on the gate insulating film GI and the gate electrode GE. The interlayer insulating film 23 is constituted by sequentially stacking, for example, a silicon nitride film and a silicon oxide film on the gate insulating film GI and the gate electrode GE.

A first electrode E1 and a second electrode E2 of the TFT are provided on the interlayer insulating film 23. In addition, a common power line PVDD is provided on the interlayer insulating film 23. Each of the first electrode E1, the second electrode E2, and the common power line PVDD adopts a three-layer stacked structure (Ti-based/Al-based/Ti-based), and includes a lowermost layer formed of a metal material containing titanium (Ti) as a main component, such as Ti or an alloy containing Ti, an intermediate layer formed of a metal material containing aluminum (Al) as a main component, such as Al or an alloy containing Al, and an uppermost layer formed of a metal material containing Ti as a main component, such as Ti or an alloy containing Ti.

The first electrode E1 is connected to the first region of the semiconductor layer SC, and the second electrode E2 is connected to the second region of the semiconductor layer SC. For example, when the first region of the semiconductor layer SC functions as the drain region, the first electrode E1 is the drain electrode, and the second electrode E2 is the source electrode. The first electrode E1 forms a storage capacitor together with the interlayer insulating film 23 and a gate electrode (storage capacitance electrode) GE of the TFT.

A planarization film 24 is formed on the interlayer insulating film 23, the first electrode E1, the second electrode E2, and the common power line PVDD so as to cover the TFT and the common power line PVDD. The planarization film 24 is removed in a region where a conductive layer 25 to be described later and the common power line PVDD are in contact with each other and a region where a relay electrode 27 to be described later and the TFT contact, and includes an opening portion. An organic insulating material such as a photosensitive acrylic is frequently used as the planarization film 24. This is excellent in coverage of line stairs and the surface planarization as compared with an inorganic insulating material formed by CVD or the like.

A conductive layer 25 is provided on the planarization film 24. The conductive layer 25 is in contact with the common power line PVDD through the opening portion formed in the planarization film 24 and is electrically connected thereto. In addition, the conductive layer 25 is not formed in a region where a relay electrode 27 to be described later and the first electrode E1 of the TFT are in contact with each other, and includes an opening portion in the region. The conductive layer 25 is formed of, for example, ITO as an oxide conductive layer.

The planarization film 24 and the conductive layer 25 are covered with an insulating layer 26. Similarly to the planarization film 24, the insulating layer 26 is removed in the region where a relay electrode 27 to be described later and the TFT are in contact with each other, and includes an opening portion. For example, the insulating layer 26 is formed of a silicon nitride film.

A relay electrode 27 is provided on the insulating layer 26. The relay electrode 27 is in contact with the first electrode E1 of the TFT via an opening portion formed in the planarization film 24 and the insulating layer 26, and is electrically connected thereto. The relay electrode 27 extends to a region opposed to the conductive layer 25 electrically connected to the common power line PVDD, such that an auxiliary capacitance is formed according to the conductive layer 25, the insulating layer 26, and the relay electrode 27 described above. The relay electrode 27 is formed of a light-shielding metal material such as aluminum (Al), titanium (Ti), molybdenum (Mo), and tungsten (W), and a stacked body of these metal materials. Alternatively, the relay electrode may be a transparent electrode such as ITO.

A planarization film 28 is formed to cover the insulating layer 26 and the relay electrode 27. The planarization film 28 is removed in the region where an anode electrode 29 to be described later and the relay electrode 27 are in contact with each other, and includes an opening portion. The planarization film 28 is formed of an organic insulating material such as a photosensitive acrylic. Incidentally, the planarization film 28 may be formed of not an organic insulating material, but an inorganic insulating material.

The anode electrode 29 that functions as a pad for mounting the light emitting element LED is provided on the planarization film 28. The anode electrode 29 is in contact with the relay electrode 27 through the opening portion formed in the planarization film 28 and is electrically connected thereto. The anode electrode 29 is formed of a light-shielding metal material such as aluminum (Al), titanium (Ti), molybdenum (Mo), and tungsten (W), and a stacked body of these metal materials.

The anode electrode 29 includes two opening portions at positions overlapping the mounting region of the light emitting element LED to take out the emitted light from the back surface side of the light emitting element LED. Since the two opening portions formed in the anode electrode 29 will be described in detail together with the plan view of FIG. 3, detailed description thereof will be omitted here.

In the display area DA, a rectangular light emitting element LED is mounted on the anode electrode 29.

The light emitting element LED includes an anode terminal AN, a cathode terminal CA, and an emitting layer LI that emits light. The anode terminal AN and the cathode terminal CA are arranged at positions opposed via the emitting layer LI. In other words, the anode terminal AN is arranged on a bottom part (back side) of the light emitting element LED, and the cathode terminal CA is arranged on an upper part (front side) of the light emitting element that is the opposite side.

While the cathode terminal CA is arranged over the entire upper surface of the light emitting element LED, the anode terminal AN is arranged not over the entire surface of the bottom part of the light emitting element LED, but at a part thereof. In other words, the anode terminal AN is formed to be smaller than the cathode terminal CA. According to this, the anode terminal AN can be electrically connected to the anode electrode 29 in the region sandwiched between the two opening portions formed in the anode electrode 29.

Junction between the anode terminal AN of the light emitting element LED and the anode electrode 29 is not particularly limited as long as good conduction between them can be secured and the formation of the array substrate AR is not damaged. In the embodiment, it is assumed that the anode terminal AN of the light emitting element LED and the anode electrode 29 are joined by a conductive material such as a solder member 30. As described above, as the anode terminal AN of the light emitting element LED is formed small, the solder member 30 that joins the anode terminal AN and the anode electrode 29 is also formed small.

An element insulating layer 31 is provided on the array substrate AR on which the light emitting element LED is mounted. The element insulating layer 31 is formed of a resin material filled in gaps between the light emitting elements LED on the array substrate AR. The element insulating layer 31 exposes surfaces of the cathodes CA, of the light emitting elements LED.

An opposing cathode electrode 32 is arranged at a position opposed to the anode electrode 29 via the light emitting element LED. The opposing cathode electrode 32 is formed on the surface of the cathode terminal CA of the light emitting element LED and on the element insulating layer 31, and is electrically connected to the cathode terminal CA by coming into contact with the cathode terminal CA. The opposing cathode electrode 32 needs to be formed as a transparent electrode to take out the emitted light from the light emitting element LED. The opposing cathode electrode 32 is formed by using, for example, ITO as a transparent conductive material. The opposing cathode electrode 32 commonly connects the cathode terminals CA of the plurality of light emitting elements LED mounted in the display area DA.

Figure 3:
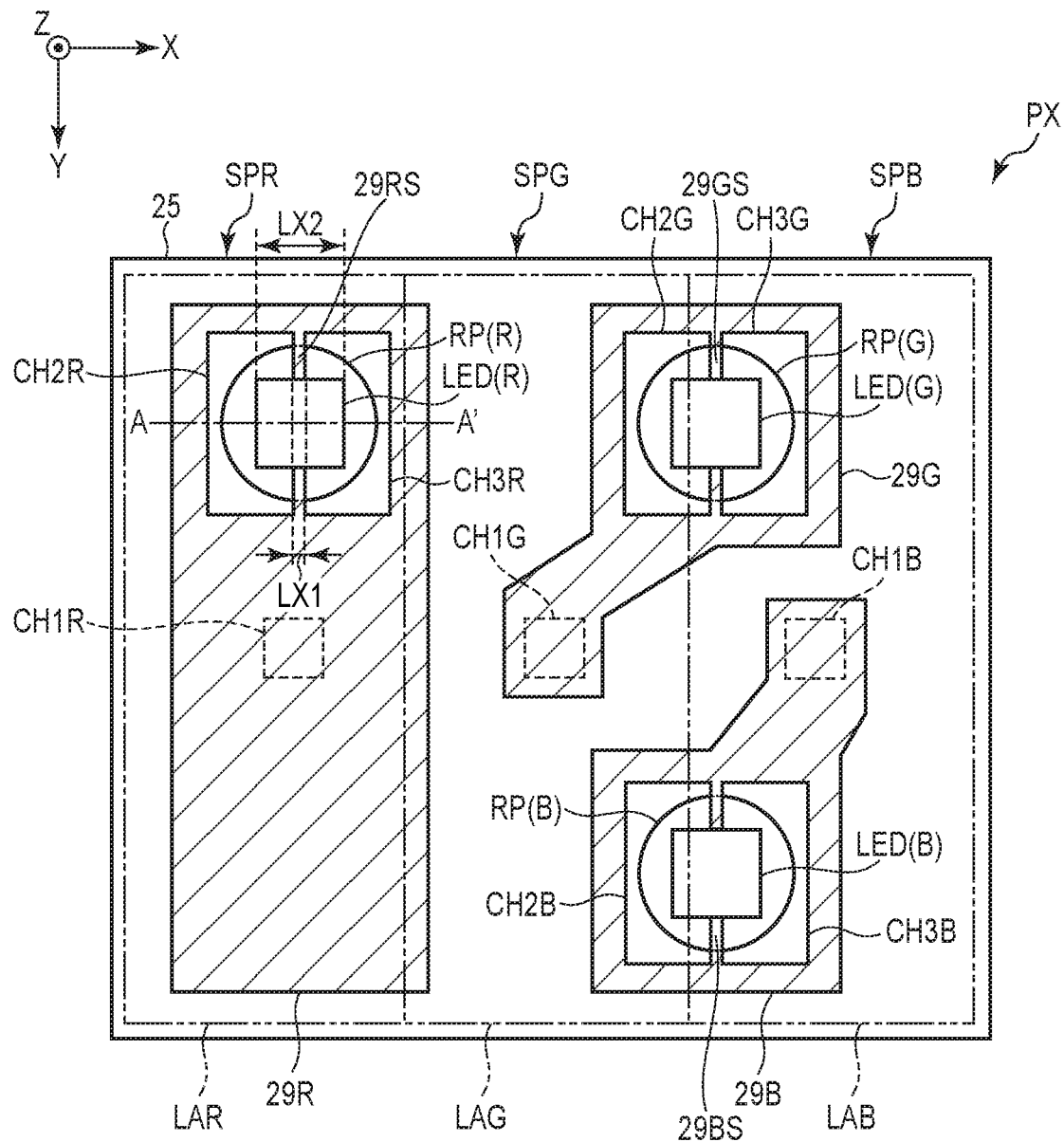
FIG. 3 is a plan view showing an example of a layout of anode electrodes for a pixel included in the display device according to the embodiment.

FIG. 3 is a plan view showing an example of the layout (shape) of anode electrodes 29 with respect to the pixel PX (sub-pixels SPR, SPG, and SPB) in the embodiment.

As shown in FIG. 3, the pixel PX including the sub-pixels SPR, SPG, and SPB shares a single conductive layer 25. In other words, the conductive layer 25 is formed to extend continuously across the plurality of sub-pixels SPR, SPG, and SPB (i.e., a plurality of pixels PX). Incidentally, the conductive layer 25 is located under the anode electrode 29 as described above.

In addition, in FIG. 3, the anode electrode 29 included in the sub-pixel SPR (i.e., the anode electrode 29 connected to the light emitting element LED (R) of the sub-pixel SPR) is referred to as an anode electrode 29R for convenience. Furthermore, the anode electrode 29 included in the sub-pixel SPG (i.e., the anode electrode 29 connected to the light emitting element LED (G) of the sub-pixel SPG) is referred to as an anode electrode 29G for convenience. Similarly, the anode electrode 29 included in the sub-pixel SPB (i.e., the anode electrode 29 connected to the light emitting element LED (B) of the sub-pixel SPB) is referred to as an anode electrode 29B for convenience.

In the plan view of FIG. 3, the anode electrode 29R is formed in a rectangular shape. In addition, the anode electrodes 29G and 29B are formed in a non-rectangular shape. Incidentally, the anode electrodes 29R, 29G, and 29B are formed such that the anode electrodes 29R have the largest size and that the anode electrodes 29G and 29B have the same size. Incidentally, the sizes of the anode electrodes 29G and 29B may be different from each other.

In addition, arrangement regions LAR, LAG, and LAB are aligned in the first direction X. The arrangement region LAR is a region in which the remaining elements other than, for example, the anode electrode 29R, in the pixel circuit of the sub-pixel SPR are arranged. The arrangement region LAG is a region in which the remaining elements other than, for example, the light emitting element LED (G) and the anode electrode 29G, are arranged in the pixel circuit of the sub-pixel SPG. The arrangement region LAB is a region in which the remaining elements other than, for example, the light emitting element LED (B) and the anode electrode 29B, in the pixel circuit of the sub-pixel SPB are arranged.

In the example shown in FIG. 3, the light emitting element LED (R) is located in the arrangement region LAR, but each of the light emitting elements LED (G) and LED (B) is located to straddle the arrangement regions LAG and LAB.

In addition, in the example shown in FIG. 3, the anode electrode 29R is located in the arrangement region LAR and further located in the arrangement region LAG. In addition, each of the anode electrodes 29G and 29B is located in the arrangement regions LAG and LAB. Incidentally, the anode electrodes 29 (29R, 29G, and 29B) may be provided to be located in the arrangement regions of the adjacent pixel PX.

As shown in FIG. 3, the conductive layer 25 includes opening portions CH1R, CH1G, and CH1B. The opening portion CH1R is an opening portion formed in the conductive layer 25 to contact (the relay electrode 27 electrically connected to) the anode electrode 29R and the TFT located under the anode electrode 29R. The opening portion CH1G is an opening portion formed in the conductive layer 25 to contact (the relay electrode 27 electrically connected to) the anode electrode 29G and the TFT located under the anode electrode 29G. The opening portion CH1B is an opening portion formed in the conductive layer 25 to contact (the relay electrode 27 electrically connected to) the anode electrode 29B and the TFT located under the anode electrode 29B. In the example shown in FIG. 3, the opening portions CH1R, CH1G, and CH1B are arranged in a straight line extending in the first direction X.

In addition, as shown in FIG. 3, the anode electrode 29R includes two opening portions CH2R and CH3R formed at positions overlapping the mounting region of the light emitting element LED (R). The two opening portions CH2R and CH3R are formed side by side in the first direction X with a predetermined interval. Incidentally, in the anode electrode 29R, a region sandwiched between the two opening portions CH2R and CH3R (i.e., a region between the two opening portions CH2R and CH3R) may be referred to as an anode electrode linear portion 29RS.

As shown in FIG. 3, in a plan view, a length LX1 in the first direction X of the anode electrode linear portion 29RS between the two opening portions CH2R and CH3R (i.e., a length of the above-described predetermined interval) is shorter than a length LX2 in the first direction X of the light emitting element LED (R) (more specifically, a length in the first direction of the cathode terminal CA of the light emitting element LED (R)).

More specifically, the length LX1 in the first direction X of the anode electrode linear portion 29RS between the two opening portions CH2R and CH3R is, desirably, approximately one third of a length LX2 in the first direction X of the cathode terminal CA of the light emitting element LED (R). In other words, the size of the anode electrode 29 at the position overlapping the mounting region of the light emitting element LED (R) is, desirably, approximately one third of the size of the cathode terminal CA of the light emitting element LED (R).

The opening portions CH2R and CH3R are opening portions formed to take out emitted light from the back surface side (anode terminal AN side) of the light emitting element LED (R). The anode terminal AN of the light emitting element LED (R) is joined to the anode electrode 29R via the solder member 30 in the anode electrode linear portion 29RS between the opening portions CH2R and CH3R. In addition, in the anode electrode 29, a portion connected to the anode terminal AN may be designed to be small similarly to the anode electrode linear portion, the opening portion CH2 or CH3 may not be formed and a part of the anode electrode 29 may be formed in a fine wire shape in the only surrounding of the light emitting element LED.

As shown in FIG. 3, the circular reflector plate RP (R) having a circular shape in planar view is provided at a position overlapping the mounting region of the light emitting element LED (R). In other words, a reflector plate RP (R) is provided at a position overlapping the two opening portions CH2R and CH3R formed in the anode electrode 29R. As shown in FIG. 3, the reflector plate RP (R) is arranged under the anode electrode 29R. FIG. 3 shows a case where the reflector plate RP (R) is larger than the mounting region of the light emitting element LED (R) and is smaller than the rectangular region including the two opening portions CH2R and CH3R and the anode electrode linear portion 29RS between the opening portions CH2R and CH3R, but the reflector plate RP (R) may be larger than the mounting region of the light emitting element LED (R). In other words, the reflector plate RP (R) may be larger than the rectangular region including the two opening portions CH2R and CH3R and the anode electrode linear portion 29RS between the opening portions CH2R and CH3R.

The two opening portions CH2R and CH3R formed in the anode electrode 29R, and the reflector plate RP (R) arranged under the anode electrode 29R have been described by exemplifying the anode electrode 29R, but the above matters are also applicable to the anode electrodes 29G and 29B. In other words, the anode electrode 29G includes two opening portions CH2G and CH3G, and a reflector plate RP (G) is arranged under the opening portions. Similarly, the anode electrode 29B includes two opening portions CH2B and CH3B, and a reflector plate RP (B) is arranged under the opening portions.

Figure 4:
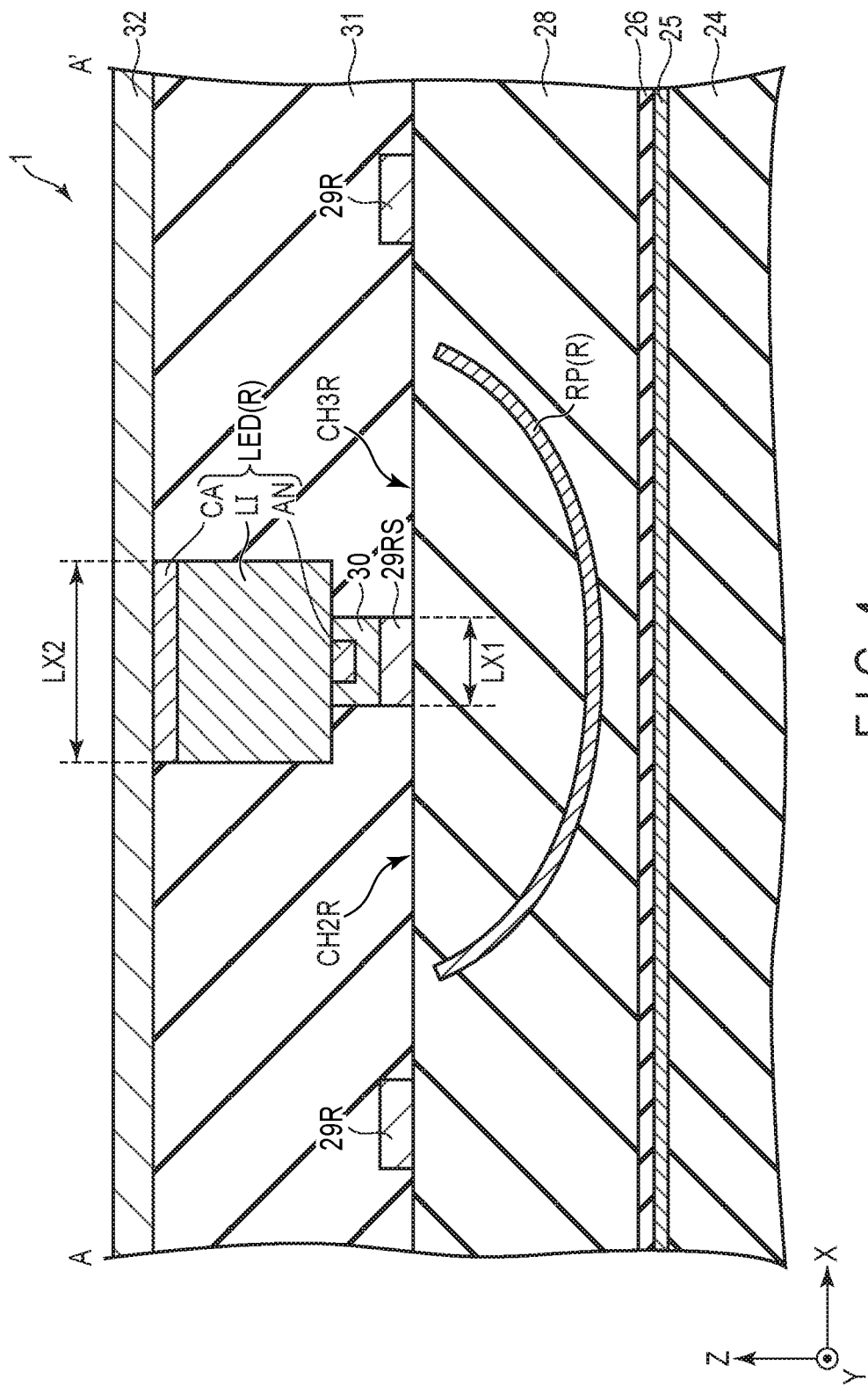
FIG. 4 is a cross-sectional view schematically showing a cross section cut along line A-A' shown in FIG. 3.

FIG. 4 shows a cross section of the display device 1 (display panel 2) cut along line A-A' shown in FIG. 3. In FIG. 4, illustration of the elements located under the planarization film 24 is omitted.

As shown in FIG. 4, the conductive layer 25, the insulating layer 26, and the planarization film 28 are stacked in this order on the planarization film 24.

As shown in FIG. 4, the thin wire-shaped anode electrode linear portion 29RS extending in the second direction Y is formed on the planarization film 28. In other words, two opening portions CH2R and CH3R are formed on the left and right sides of the thin wire-shaped anode electrode linear portion 29RS. As shown in FIG. 4, the thin wire-shaped anode electrode linear portion 29RS has a length of LX1 in the first direction X.

The thin wire-shaped anode electrode 29RS is joined to the anode terminal AN of the light emitting element LED (R) by a solder member 30. As shown in FIG. 4, the light emitting element LED (R) includes an anode terminal AN, an emitting layer LI, and a cathode terminal CA, and the cathode terminal CA (and the emitting layer LI) has a length LX2 in the first direction X.

As described above, the length LX1 in the first direction X of the thin wire-shaped anode electrode 29RS is desirably one third of the length LX2 in the first direction X of the cathode terminal CA of the light emitting element LED (R).

As shown in FIG. 4, a reflector plate RP (R) shaped in a hemispherical concave is provided at a position of the planarization film 28, which overlaps the mounting region of the light emitting element LED (R). The hemispherical concave-shaped reflector plate RP (R) is provided to reflect the light from the back surface side (i.e., the anode terminal AN side) of the light emitting element LED (R) and collect the light in the front direction of the display panel 2. For this reason, the hemispherical concave-shaped reflector plate RP (R) needs to be formed to be larger than the mounting region of the light emitting element LED (R). The reflector plate RP (R) is formed of, for example, aluminum (Al), silver (Ag), or the like. Incidentally, the reflector plate RP (R) may be formed of a metal material other than the above-mentioned Al and Ag as long as it is a metal material having a characteristic of being able to reflect the light emitted from the light emitting element LED (R).

Incidentally, a case where the reflector plate RP (R) is provided on the planarization film 28 has been exemplified, but the reflector plate RP (R) may be provided in any layer as long as it is a layer located under the anode electrode 29R. However, since it is necessary to reflect the light from the back surface side of the light emitting element LED (R) and collect the light in the front direction of the display panel 2, the reflector plate RP (R) is desirably arranged above the metal wire such as the TFT. According to this, it is possible to suppress the light from the back surface side of the light emitting element LED (R), not reaching the reflector plate RP (R) due to the metal wire such as the TFT which is an obstacle, and the light reflected by the reflector plate RP (R), not being collected in the front direction of the display panel 2 due to the metal wire of the TFT which is an obstacle.

Advantages of the display device 1 according to the embodiment will be described below with reference to a comparative example. The comparative example aims to explain parts of the advantages that the display device 1 according to the embodiment can exert, and the configurations and advantages common to the embodiment and the comparative example are not excluded from the scope of the present invention.

FIG. 5 schematically shows the cross-sectional structure of a display device 100 according to the comparative example, and is a schematic view illustrating a manner of taking out the emitted light from the light emitting element LED mounted on the display device 100.

The display device 100 according to the comparative example is different from the display device 1 according to the embodiment in that opening portions are not provided in the anode electrode 29 arranged on the back surface side of the light emitting element LED and that the reflector plate RP is not provided under the anode electrode 29.

In general, the light emitting element LED has a characteristic of high efficiency light emission while the emitted light of the light emitting element LED has low extraction efficiency as shown in FIG. 5, and even if the light can be extracted, it tends to diffuse in multiple directions. Since the display device 100 according to the comparative example is not devised with respect to a manner of taking out the emitted light, the display device displays an image on the display panel using the emitted light diffused in multiple directions, part of the light reflected by the anode electrode 29 arranged on the back surface side of the light emitting element LED (more specifically, light whose incident angle on the emission surface is smaller than a critical angle and which can be taken out as emitted light).

However, there is a problem that since the emitted light used to display an image on the display panel is limited to the emitted light in the front direction of the display panel, the extraction efficiency of the emitted light is low and the luminance in the front direction of the display panel is lowered when displaying an image using the emitted light diffused in multiple directions as performed in the display device 100 according to the comparative example. This makes the image hard to see and is not desirable for an observer.

Figure 6:
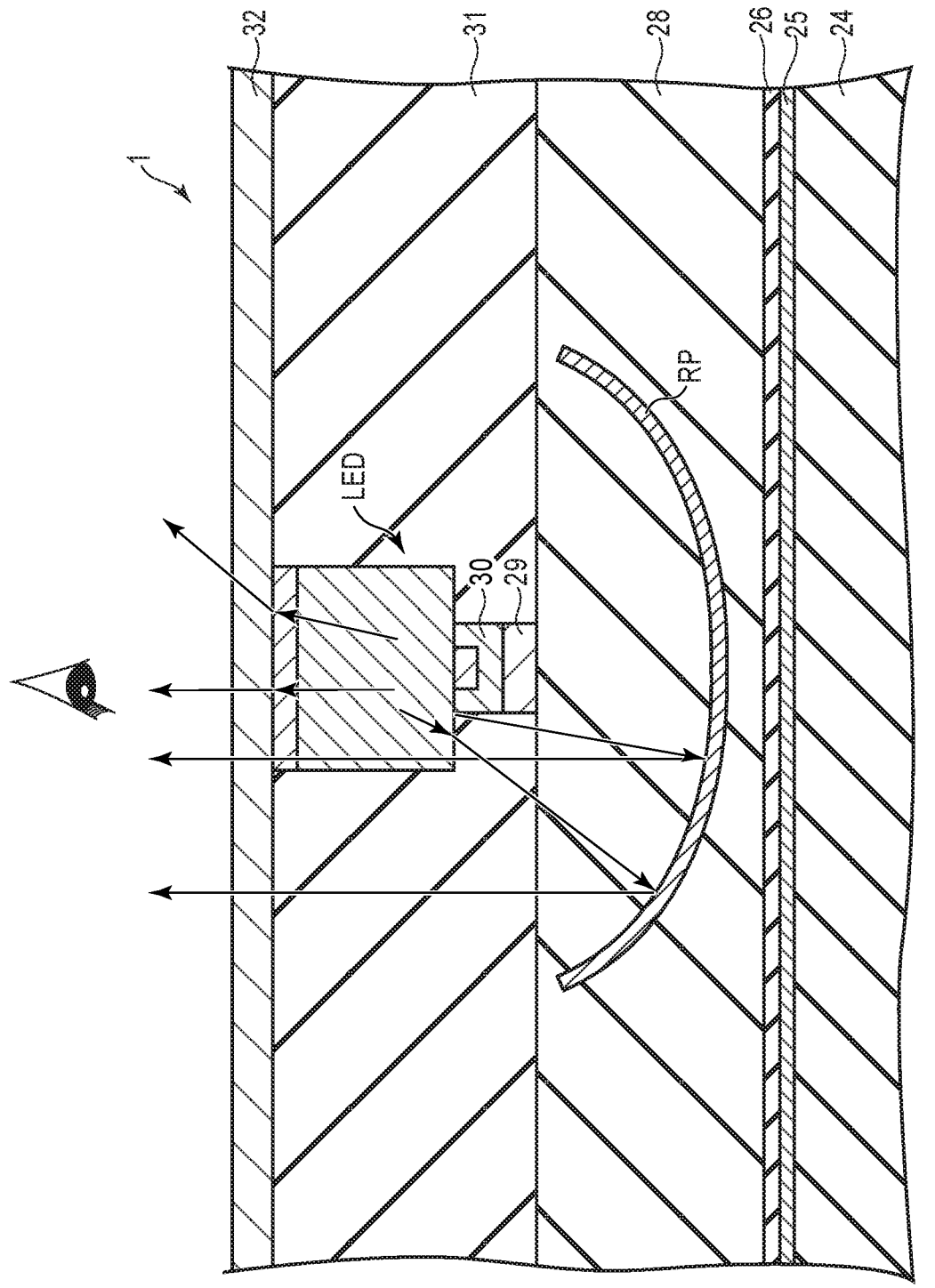
FIG. 6 is a schematic diagram illustrating a manner of taking out the emitted light from a light emitting element with respect to the display device according to the embodiment.

In contrast, in the display device 1 according to the embodiment, it is possible to take out the emitted light from the back surface side of the light emitting element LED by providing an opening portion in the anode electrode 29 arranged on the back surface side of the light emitting element LED, and to collect the light emitted to the back surface side of the light emitting element LED, in the front direction of the display panel 2 by providing the reflector plate RP under the anode electrode 29, as shown in FIG. 6.

According to this, the quantity of light in the front direction of the display panel 2 can be improved as compared with the display device 100 according to the comparative example, and then the luminance in the front direction of the display panel 2 can be improved.

Incidentally, in the display device 1 according to the embodiment, the light is collected in the front direction of the display panel 2 by providing the opening portions in the anode electrode 29 arranged on the back surface side of the light emitting element LED and providing the reflector plate RP under the anode electrode 29, as described above, but another method of collecting the light in the front direction of the display panel 2 is, for example, a method of condensing the emitted light in the front direction of the display panel by providing a condenser on the emission surface side of the light emitting element LED.

In the case of this method, after mounting the light emitting element LED, a condensing lens needs to be provided in consideration of the positional relationship with the mounted light emitting element LED but, since the light emitting element LED is mounted not for each large backplane, but for each display panel, a condenser also needs to be provided for each display panel. This is not very desirable considering the labor required for manufacturing.

In contrast, according to the display device 1 according to the embodiment, since the opening portions can be provided in the anode electrode 29 and the reflector plate RP can be provided under the anode electrode 29 before mounting the light emitting element LED, processing can be performed not for each display panel, but for each backplane. Thus, the labor required for manufacturing can also be reduced in the display device 1 according to the embodiments.

As described above, the display device 1 according to the embodiment comprises the array substrate AR, the anode electrode 29 arranged on the array substrate AR, the light emitting element LED mounted on the anode electrode 29, and the reflector plate RP which is arranged under the anode electrode 29 and which is arranged to overlap a region where the light emitting element LED is mounted in planar view, and has characteristics that the light emitting element LED is arranged at the bottom part and includes the anode terminal AN electrically connected to the anode electrode 29 and the cathode terminal CA arranged over the entire upper surface on the opposite side to the anode terminal AN, and that the anode electrode 29 is smaller than the cathode terminal CA in a position overlapping the region where the light emitting element LED is mounted in planar view.

According to this, the emitted light can be taken out from the back surface side of the light emitting element LED, and the emitted light on the back surface side can be reflected by the reflector plate RP and collected in the front direction of the display device 1. In other words, the quantity of light in the front direction of the micro LED display (display device 1) can be improved, and the luminance in the front direction can be improved.

Modified examples of the display device 1 according to the embodiment will be described below.

FIRST MODIFIED EXAMPLE

Figure 7:
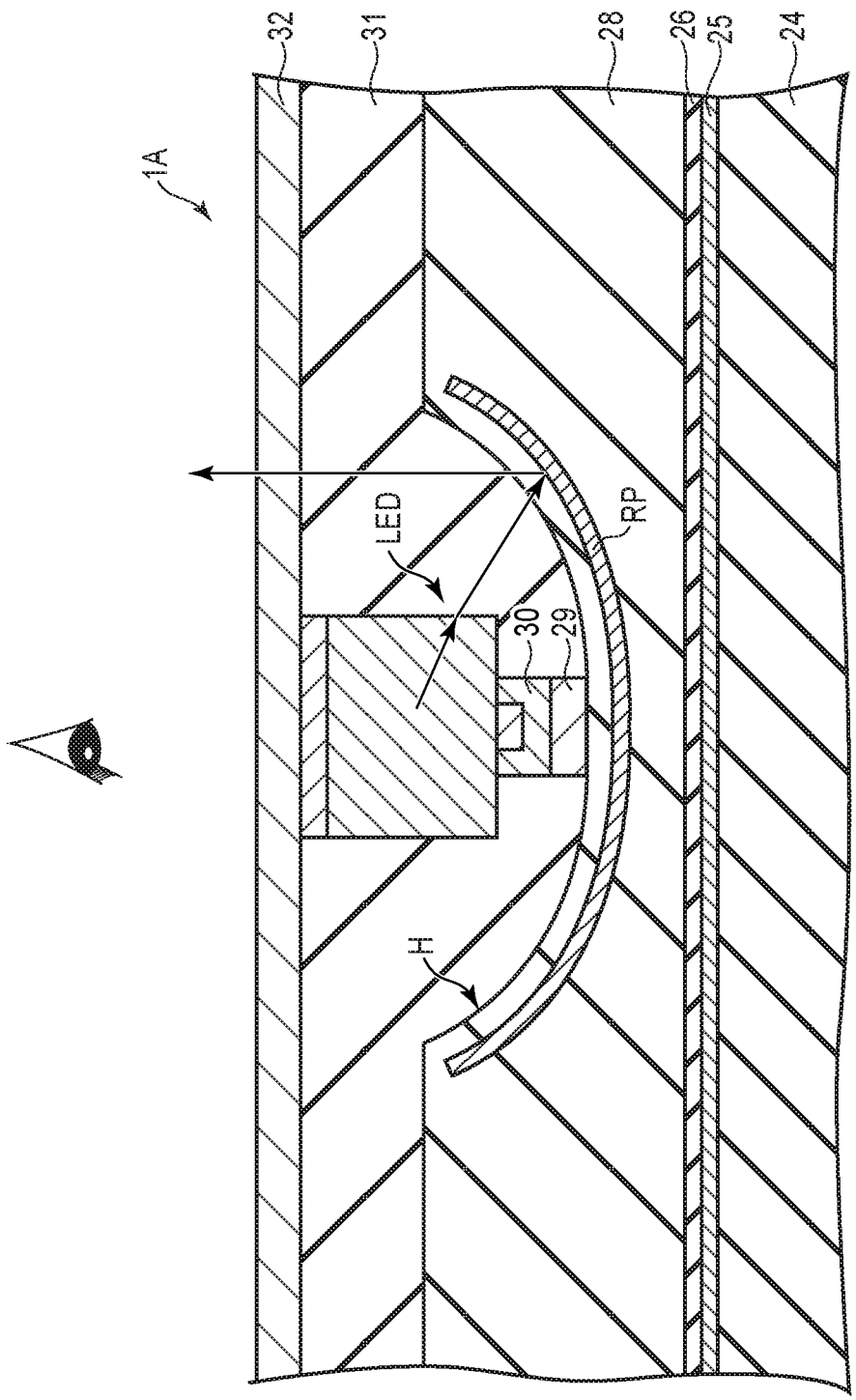
FIG. 7 is a cross-sectional view schematically showing an example of a sectional structure of the display device according to a first modified example of the embodiment.

FIG. 7 schematically shows a sectional structure of a display device 1A according to a first modified example of the embodiment, and is a schematic view illustrating a manner of taking out the emitted from the light emitting element LED mounted on the display device 1A. In FIG. 7, illustration of the light taken out similarly to that in FIG. 6 is omitted, and shows the only light that is not taken out in FIG. 6.

The display device 1A according to the first modified example is different from the structure shown in FIG. 6 in that the planarization film 28 includes a hole H shaped in a hemispherical concave in the mounting region of the light emitting element LED and that the light emitting element LED is mounted to be inserted into the hemispherical concave-shaped hole H, as shown in FIG. 7. Incidentally, the hemispherical concave-shaped hole H formed in the planarization film 28 is formed by, for example, patterning.

First, the display device 1A according to the first modified example can reflect the light emitted to the back surface side of the light emitting element LED, on the reflector plate RP provided under the anode electrode 29, and collect the light in the front direction of the display panel 2, similarly to the structure shown in FIG. 6. According to this, the same advantages as those in the case of FIG. 6 can be achieved.

In addition, in the display device 1A according to the first modified example, as shown in FIG. 7, the light emitting element LED is arranged in the hemispherical concave-shaped hole H formed in the planarization film 28, and an improvement in the efficiency of taking out the light emitted downward from the side surface of the light emitting element LED can be expected by making the height at which the light emitting device LED is arranged close to (match) the height at which the reflector plate RP is arranged.

The light taken out from the emission surface of the light emitting element LED as effective light is limited to the light in the normal of the emission surface of the light emitting element LED and the light whose incident angle on the emission surface is smaller than a critical angle. In other words, the light taken out from the side surface of the light emitting element LED as the effective light is also limited to the light in the normal of the side surface of the light emitting element LED and the light whose incident angle on the side surface is smaller than the critical angle. For this reason, there is a problem that the light emitted downward from the side surface of the light emitting element LED can hardly be taken out as effective light, and the light emitted from the side surface of the light emitting element LED cannot be effectively utilized.

In contrast, in the display device 1A according to the first modified example, since the light emitting element LED is arranged in the hemispherical concave-shaped hole H formed in the planarization film 28 and since the height at which the light emitting device LED is arranged is made to be close to (to match) the height at which the reflector plate RP is arranged, the light whose incident angle on the side surface of the light emitting element LED is smaller than the critical angle can be taken out as the effective light emitted downward from the side surface of the light emitting element LED.

In other words, as shown in FIG. 7, the display device 1A according to the first modified example enables not only the emitted light from the back surface side of the light emitting element LED, but also the emitted light from the side surface of the light emitting element LED to be reflected on the reflector plate RP and to be collected in the front direction of the display panel 2. According to this, the quantity of light in the front direction of the display panel 2 can be further improved, and the luminance in the front direction of the display panel 2 can be further improved.

Even in the display device 1A according to the first modified example, since the hemispherical concave-shaped hole H needs only to be formed in the planarization film 28 by, for example, patterning before mounting the light emitting element LED, processing can be performed not for each display panel, but for each backplane.

SECOND MODIFIED EXAMPLE

FIG. 8 schematically shows a sectional structure of a display device 1B according to a second modified example of the embodiment, and is a schematic view illustrating a manner of taking out the emitted from the light emitting element LED mounted on the display device 1B. In FIG. 8, illustration of the light taken out similarly to that in FIG. 6 is omitted, and shows the only light that is not taken out in FIG. 6.

The display device 1B according to the second modified example is different from the structure shown in FIG. 6 in that a light emitting element LED having a trapezoidal shape is mounted as shown in FIG. 8. The trapezoidal light emitting element LED shown in FIG. 8 has a characteristic that the lower side of the anode terminal AN side is shorter than the upper side of the cathode terminal CA side. In other words, the trapezoidal light emitting element LED shown in FIG. 8 has a characteristic that a bottom part (back surface) on the anode terminal AN side is smaller than the upper part (front surface) on the cathode terminal CA side. The light emitting element LED having such a characteristic may be referred to as, not a trapezoidal light emitting element LED, but an inverted trapezoid-shaped light emitting element LED in the following descriptions.

First, the display device 1B according to the second modified example can reflect the light emitted to the back surface side of the light emitting element LED, on the reflector plate RP provided under the anode electrode 29, and collect the light in the front direction of the display panel 2, similarly to the structure shown in FIG. 6. According to this, the same advantages as those in the case of FIG. 6 can be achieved.

In addition, in the display device 1B according to the second modified example, the improvement in the efficiency of taking out the light emitted downward from the side surface of the light emitting element LED, and the improvement in the efficiency of taking out the light emitted upward from the side surface of the light emitting element LED can be expected since the light emitting element LED has an inverted trapezoid shape as shown in FIG. 8.

As already described in the first modified example, there is a problem that the light emitted downward from the side surface of the light emitting element LED can hardly be taken out as effective light, and the light emitted from the side surface of the light emitting element LED cannot be effectively utilized.

In contrast, in the display device 1B according to the second modified example, since the light emitting element LED has an inverted trapezoidal shape, the light emitted downward from the side surface of the light emitting element LED can be taken out as the light in the normal of the side surface. In other words, as shown in FIG. 8, the display device 1B according to the second modified example enables not only the emitted light from the back surface side of the light emitting element LED, but also the emitted light from the side surface of the light emitting element LED to be reflected on the reflector plate RP and to be collected in the front direction of the display panel 2.

Furthermore, in the display device 1B according to the second modified example, since the light emitting element LED has an inverted trapezoid shape, part of the light whose incident angle on the side surface is larger than the critical angle and which is totally reflected, of the light emitted upward from the side surface of the light emitting element LED, can be taken out as the light emitted in the front direction of the display panel 2. In other words, in the display device 1B according to the second modified example, as shown in FIG. 8, the improvement in taking out not only the light emitted downward from the side surface of the light emitting element LED, but also the light emitted upward, can be expected, and further improvement in the quantity of light in the front direction of the display panel 2 and further improvement in the luminance in the front direction of the display panel 2 can be expected.

Incidentally, in the display device 1B according to the second modified example, since there is no change from the structure shown in FIG. 6 other than the shape of the light emitting element LED, processing can be performed not for each display panel, but for each backplane.

In addition, a large number of uneven parts may be formed on the surfaces (bottom part, upper part, and side surfaces) of the light emitting elements LED mounted on the above-described display devices 1, 1A, and 1B. According to this, the same advantages as those in the case shown in FIG. 8 can be expected, the quantity of light in the front direction of the display panel 2 can be further improved, and the luminance in the front direction of the display panel 2 can be further improved.

According to one of the above-described embodiment, a display device capable of improving the quantity of light in the front direction of the micro LED display can be provided.

All of the display devices that can be implemented by a person of ordinary skill in the art through arbitrary design changes to the display devices described above as embodiments of the present invention come within the scope of the present invention as long as they are in keeping with the spirit of the present invention.

Various types of the modified examples are easily conceivable within the category of the ideas of the present invention by a person of ordinary skill in the art and the modified examples are also considered to fall within the scope of the present invention. For example, additions, deletions or changes in design of the constituent elements or additions, omissions, or changes in condition of the processes arbitrarily conducted by a person of ordinary skill in the art, in the above embodiments, fall within the scope of the present invention as long as they are in keeping with the spirit of the present invention.

In addition, the other advantages of the aspects described in the embodiments, which are obvious from the descriptions of the present specification or which can be arbitrarily conceived by a person of ordinary skill in the art, are considered to be achievable by the present invention as a matter of course.

What is claimed is:
1. A display device comprising:
a substrate;
an anode electrode arranged on the substrate;
a light emitting element mounted on the anode electrode; and
a reflector plate arranged under the anode electrode, and arranged to overlap a region where the light emitting element is mounted, in planar view, wherein
the light emitting element comprises an anode terminal arranged on a bottom part and electrically connected to the anode electrode, and a cathode terminal arranged across an entire upper surface on a side opposite to the anode terminal, and the anode electrode is smaller than the cathode terminal in a position overlapping the region where the light emitting element is mounted in planar view.

2. The display device of claim 1, wherein
the anode electrode includes two opening portions formed at positions overlapping the region where the light emitting element is mounted in planar view, and is electrically connected to the anode terminal in a region sandwiched between the two opening portions in planar view.

3. The display device of claim 1, further comprising:
a drive transistor controlling a current supplied to the light emitting element via the anode electrode,
wherein
the reflector plate is arranged between the anode electrode and the drive transistor.

4. The display device of claim 1, wherein
the reflector plate is larger than the region where the light emitting element is mounted in planar view.

5. The display device of claim 4, wherein
the reflector plate is smaller than a region where the two opening portions are formed in planar view.

6. The display device of claim 1, wherein
the anode electrode is one third as large as than the cathode terminal in the position overlapping the region where the light emitting element is mounted in planar view.

7. The display device of claim 1, further comprising:
a planarization film arranged on the substrate to arrange the anode electrode,
wherein
the planarization film includes a hemispherical concave-shaped hole formed in a region where the anode electrode is arranged.

8. The display device of claim 1, wherein
the light emitting element has a rectangular shape.

9. The display device of claim 1, wherein
the light emitting element has a trapezoidal shape formed in a rectangle in which the bottom part is different in size from the upper part, and the upper part is larger than the bottom part.

10. The display device of claim 1, wherein
the light emitting element includes a large number of uneven parts on the bottom part, the upper part, and a plurality of side surfaces extending between the bottom part and the upper part.

* * * * *